United States Patent [19]

Fisher et al.

[11] 4,430,620

[45] Feb. 7, 1984

[54] DEMODULATOR SYSTEM FOR DOUBLE SIDEBAND SUPPRESSED CARRIER AMPLITUDE MODULATION

[76] Inventors: Charles B. Fisher, 2850 Hill Park Rd., Montreal, Quebec, H3H 1T1, Canada; Sidney T. Fisher, 53 Morrison Ave., Montreal, Quebec, H3R 1K3, Canada

[21] Appl. No.: 489,947

[22] Filed: Apr. 29, 1983

[51] Int. Cl.$^3$ ............................................. H03D 1/00
[52] U.S. Cl. .................................... 329/166; 329/178; 329/192; 455/202
[58] Field of Search ................. 329/50, 101, 166, 178, 329/192, 203, 204, 205 R, 206; 455/202, 337

[56] References Cited

U.S. PATENT DOCUMENTS 2,979,611  4/1961  Halina .................................. 455/202
3,375,453  3/1968  Adler .................................. 329/50 X

*Primary Examiner*—Siegfried H. Grimm

[57] ABSTRACT

A system and a receiver for transmission of signals by a double sideband amplitude modulated carrier with the carrier suppressed, known as a DSBSC wave, without reinsertion of the carrier at the receiver. In the receiver the DSBSC wave is amplified, demodulated by a full-wave rectifier, and the rectifier output reversed in polarity at instants of successive zero crossings of the signal, to produce the signal free from extraneous components.

6 Claims, 5 Drawing Figures

DEMODULATOR SYSTEM FOR DOUBLE SIDEBAND SUPPRESSED CARRIER AMPLITUDE MODULATION

BACKGROUND OF THE INVENTION

Method and means for producing a wave consisting of a carrier amplitude modulated by a signal, with the carrier suppressed, receiving such a wave and demodulating it without reinsertion of the carrier, to produce the signal.

In the prior art a wave consisting of a carrier, double sideband amplitude modulated by a signal, with the carrier suppressed, known as a DSBSC wave, is used with a receiver in which the carrier is reinserted before demodulation to recover the signal.

In this invention the DSBSC wave is produced as in the prior art, and the receiver demodulates the wave by full-wave rectification, followed by reversal of alternate portions of the demodulated wave, spaced between instants at which the signal has successive zero crossings.

The system and the receiver of this invention have utility, as they allow transmission of signals without the complications of synchronization and reinsertion of the carrier at the receiver.

SUMMARY OF THE INVENTION

Species 1

This consists of transmission means for the DSBSC wave generated by a signal, a transmission path for the DSBSC wave, and receiving means for the DSBSC wave, which delivers the signal as output. The transmission means is known in the prior art, but the receiving means has features not found in the prior art, as is described under Species 2.

Species 2

The DSBSC wave is received and amplified, gain being controlled by a low amplitude of carrier from the transmission means. The amplified DSBSC wave is demodulated by a full-wave rectifier, with a filter to block the DSBSC wave. Control pulses are produced from the output of the rectifier by a pulse generator, at instants of minimum amplitude of the rectified wave corresponding to zero crossings of the signal. Reversing means receives the control pulses and reverses the polarity of alternate portions of the rectified wave lying between successive control pulses. The output of the reversing means is freed from extraneous components and delivered as the signal.

DETAILED DESCRIPTION OF THE ILLUSTRATED EMBODIMENTS

Figure 1:
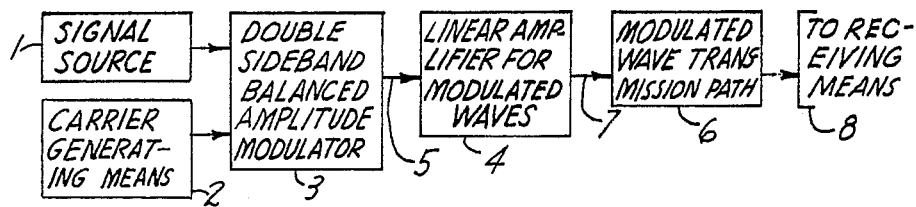
FIG. 1 shows transmission means for a DSBSC wave in simplified block schematic form, as known in the prior art.

FIG. 1 shows transmission means for a DSBSC wave in simplified block schematic form, as known in the prior art.

Signal source 1 delivers a signal with a dc component with amplitude which is not material, to double sideband balanced amplitude modulator 3, which also receives carrier of substantially constant frequency and amplitude from carrier generating means 2. The output of modulator 3, which consists of the signal sidebands of the carrier, with a low amplitude carrier, is delivered to linear amplifier 4 for modulated waves over lead 5. The output of amplifier 4 is delivered to transmission path 6 through lead 7 to receiving means 8.

Elements of FIG. 1 are known in the prior art, for example a suitable linear power amplifier is disclosed in U.S. Pat. No. 4,249,135.

Figure 2:
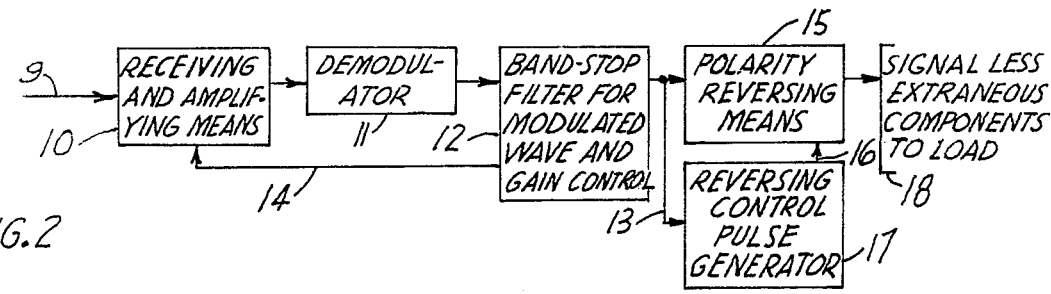
FIG. 2 shows receiving means for a DSBSC wave in simplified block schematic form, according to the invention.

FIG. 2 shows receiving means for a DSBSC wave in simplified block schematic form, according to the invention.

A DSBSC wave is delivered from item 8 of FIG. 1, or from other means not shown, to lead 9 to amplifying and receiving means 10, in which the gain is automatically controlled over lead 14 by rectified low level carrier. This circuit is known in the prior art. The output of amplifying means 10 is delivered to demodulator 11, which may be a full-wave rectifier, delivering its output to band-stop filter 12, which blocks the DSBSC wave and separates the low level rectified carrier on lead 14 for gain control. Such a filter is known in the prior art. The rectified DSBSC wave output of filter 12 is delivered to polarity reversing means 15 and to reversing control pulse generator 17 over lead 13.

Generator 17 produces a control pulse at each minimum of the output of item 12, corresponding to a zero crossing of the signal from source 1 or elsewhere which produces the DSBSC wave on lead 9. The pulses may be of the same or alternate polarities, and may vary in duration from very short to the period between successive control pulses. Circuits for generating such pulses are found in the prior art.

Polarity reversing means 15 receives the control pulses from generator 17 over lead 16, and reverses its input wave at each successive pulse, so that alternate portions of output of 15 are of alternate polarity. With a DSBSC wave produced by a sine-wave signal, the output of filter 12 consists of a sequence of half-sine waves of the same polarity, and the output of reversing means 15 consists of a sequence of half-sine waves of alternate polarity, which is the sine wave of the signal. The output of reversing means 15 is delivered to external load 18, less any extraneous components outside the signal frequency band, removed by the output connections.

Figure 3:
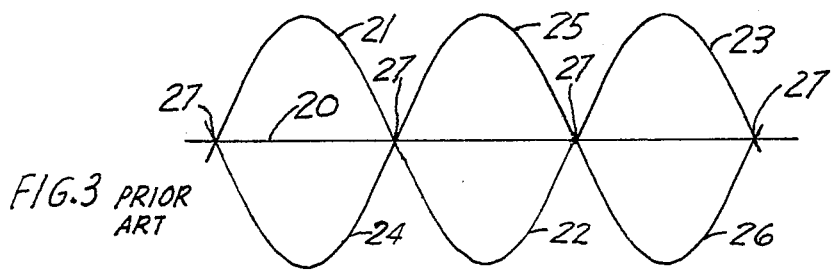
FIG. 3 shows the loci of the positive and negative peaks of a DSBSC wave with a sine-wave signal, according to the prior art.

FIG. 3 shows the loci of the positive and negative peaks of a DSBSC wave produced by a sine-wave signal, according to the prior art. Zero base 20 carries the locus 21, 25 and 23 of positive peaks, and the locus 24, 22 and 26 of negative peaks. Sections 21, 22 and 23, and 24, 25 and 26 each have the wave-form of the signal. The points of minimum amplitude corresponding to zero crossings of the signal are shown at 27.

Figure 4:
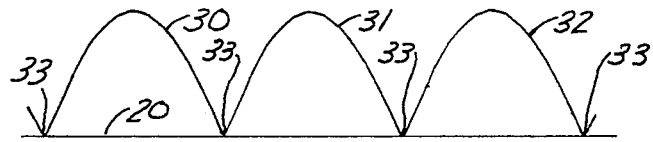
FIG. 4 shows the output wave of a full-wave rectifier which rectifies a DSBSC wave with a sine-wave signal, according to the prior art.

FIG. 4 shows the wave-form of a DSBSC wave on zero base 20 after full-wave rectification, as found in the prior art.

Figure 5:
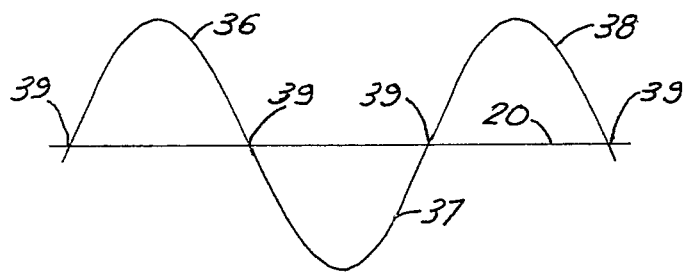
FIG. 5 shows a sine-wave output of polarity reversing means which receives the rectified wave of FIG. 4, and reverses alternate portions, at instants of successive minimum values of the rectified wave, to deliver the signal, according to the invention.

FIG. 5 shows the wave at the output of the reversing means on zero base 20. Half-sine waves 36, 37 and 38 correspond respectively to half-sine waves 30, 31 reversed and 32 of FIG. 4. Zero crossings of FIG. 5 at 39 correspond to instants of minimum amplitude 33 of FIG. 4. The wave of FIG. 5 has the same wave-form as the signal which produced the DSBSC wave on lead 9 of FIG. 2.

Since many changes could be made in the methods and constructions shown above, and many widely different embodiments could be made without departing from the scope of the invention, it is intended that all matter contained in the above description or the accompanying drawings shall be interpreted as illustrative only and not limiting.

We claim:

1. The method of transmitting a signal which has no material dc component, which comprises:

generating and transmitting a modulated wave consisting of a carrier of substantitally constant amplitude and frequency, double sideband amplitude modulated by said signal, with said carrier suppressed to a low amplitude, and receiving and amplifying said modulated wave, and deriving said signal in substantially undistorted form from said amplified modulated wave;

wherein the improvement over prior art consists of:

demodulating said amplified modulated wave to produce a demodulated wave containing substantially only a low amplitude of dc and harmonics of said signal but not the frequencies of said signal, and filtering said demodulated wave to remove said amplified modulated wave, and alternately reversing in polarity the portions of said filtered demodulated wave, between instants at which said filtered demodulated wave has minimum amplitude corresponding to zero crossings of said signal, and delivering said filtered demodulated wave, with said portions alternately reversed in polarity and freed from extraneous components, as said signal.

2. The method of deriving a signal from a modulated wave consisting of a carrier of substantially constant amplitude and frequency, double sideband amplitude modulated by said signal, said signal having no material dc component, said carrier suppressed to a low amplitude, which comprises:

receiving and amplifying said modulated wave, and rectifying and filtering said carrier of low amplitude, and using said rectified and filtered carrier to control said amplifying of said modulated wave:

wherein the improvement over prior art consists of:

demodulating said amplified modulated wave to produce a demodulated wave containing substantially only a low amplitude of dc, and the harmonics of said signal but not said signal, and filtering said demodulated wave to remove said amplified modulated wave, and generating control pulses substantially at instants of minimum amplitude of said amplified modulated wave corresponding to zero crossings of said signal, and alternately reversing in polarity by use of said control pulses the alternate portions of the filtered demodulated wave, between instants at which said filtered demodulated wave has minimum amplitude corresponding to zero crossings of said signal, and delivering said filtered demodulated wave, with said portions alternately reversed in polarity and freed from extraneous components, as said signal.

3. The method of deriving a signal according to claim 2, in which said amplified modulated wave is demodulated by full-wave rectification, with filtering-out of said amplified modulated wave.

4. Transmission means for a signal which has no material dc component, which comprises:

a signal source, and carrier generating means for a carrier of substantially constant frequency and constant amplitude, and a double sideband balanced amplitude modulator, in which said signal modulates said carrier, to produce a modulated wave with the carrier suppressed to a low amplitude, and amplifying means for said modulated wave, and a transmission path for said amplified modulated wave, and receiving and amplifying means receiving said modulated wave from said path, said amplifying means being supplied with automatic gain control by voltage from a rectifier and filter receiving said low amplitude carrier;

wherein the improvement over means of the prior art consists of:

a demodulator for said amplified modulated wave which produces a wave containing substantially only a low amplitude of dc from the low amplitude carrier, and the harmonics of said signal but not said signal and a filter which removes substantially only said modulated wave from the output of said demodulator, and a pulse generator receiving the output of said demodulator, for generating control pulses at instants of minimum amplitude of said output which correspond to zero crossings of said signal, and reversing means which receives said control pulses and reverses the polarity of alternate portions of said filtered demodulator output between instants at which said pulses successively occur, and means which delivers to a load said portions, alternately reversed in polarity and freed from extraneous components, as said signal.

5. Receiving means for deriving a signal from a carrier double sideband amplitude modulated by said signal, with said carrier suppressed to a low amplitude, said signal having no material dc component, which comprises:

means for accepting and amplifying said modulated carrier, automatically controlled in gain by dc voltage from a rectifier and filter receiving said low amplitude carrier;

wherein the improvement over means of the prior art consists of:

a demodulator for said amplified modulated carrier, which produces a wave containing substantially only a low amplitude dc from the low amplitude carrier and the harmonics of said signal but not said signal, and a filter which removes substantially only said modulated wave from the output of said demodulator, and a pulse generator receiving the output of said demodulator, for generating control pulses at instants of minimum amplitude of said output which correspond to zero crossings of said signal, and reversing means which receives said control pulses and reverses the polarity of alternate portions of said filtered demodulator output, between instants at which said pulses successively occur, and means which delivers to a load said portions, alternately reversed in polarity and freed from extraneous components, as said signal.

6. Receiving means according to claim 5, in which said demodulator is a full-wave rectifier.

* * * * *